(12) United States Patent
Mo et al.

(10) Patent No.: US 11,557,611 B2
(45) Date of Patent: Jan. 17, 2023

(54) METHOD AND DEVICE FOR MANUFACTURING ARRAY SUBSTRATE, AND ARRAY SUBSTRATE

(71) Applicant: HKC CORPORATION LIMITED, Guangdong (CN)

(72) Inventors: Qionghua Mo, Guangdong (CN); En-tsung Cho, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 79 days.

(21) Appl. No.: 17/272,939

(22) PCT Filed: Dec. 6, 2019

(86) PCT No.: PCT/CN2019/123618
§ 371 (c)(1),
(2) Date: Mar. 3, 2021

(87) PCT Pub. No.: WO2020/134965
PCT Pub. Date: Jul. 2, 2020

(65) Prior Publication Data
US 2021/0327914 A1 Oct. 21, 2021

(30) Foreign Application Priority Data
Dec. 25, 2018 (CN) .......................... 201811598405.4

(51) Int. Cl.
*H01L 27/12* (2006.01)
*H01L 29/423* (2006.01)
(Continued)

(52) U.S. Cl.
CPC .... *H01L 27/1222* (2013.01); *H01L 29/42364* (2013.01); *H01L 29/66765* (2013.01); *H01L 29/78669* (2013.01)

(58) Field of Classification Search
CPC .......... H01L 27/1222; H01L 29/42364; H01L 29/66765; H01L 29/78669; H01L 29/42384; H01L 29/78621
See application file for complete search history.

(56) References Cited

U.S. PATENT DOCUMENTS

2001/0049163 A1 12/2001 Yamazaki et al.
2021/0375952 A1* 12/2021 Tian .................... H01L 29/4908

FOREIGN PATENT DOCUMENTS

CN 101893799 A 11/2010
CN 103489920 A * 1/2014 ......... H01L 27/1225
(Continued)

OTHER PUBLICATIONS

First Office Action in counterpart Chinese Application No. 201811598405.4, dated Apr. 17, 2020.
(Continued)

*Primary Examiner* — Mohammed R Alam

(57) ABSTRACT

Disclosed are a method and a device for manufacturing an array substrate, and an array substrate. The method includes: depositing and forming a gate insulation layer on a pre-formed base substrate and a pre-formed gate, the gate insulation layer covering the pre-formed gate; depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top; etching patterns of the amorphous silicon layer, the doped amorphous silicon layer and the metal layer to form the array substrate.

12 Claims, 7 Drawing Sheets

(51) Int. Cl.
   *H01L 29/66*      (2006.01)
   *H01L 29/786*     (2006.01)

(56)           References Cited

FOREIGN PATENT DOCUMENTS

| CN | 103489920 A |   | 1/2014  |        |            |
|----|-------------|---|---------|--------|------------|
| CN | 106571399 A |   | 4/2017  |        |            |
| CN | 108987279 A | * | 12/2018 | ......... | H01L 29/6675 |
| CN | 108987279 A |   | 12/2018 |        |            |
| CN | 109065632 A | * | 12/2018 |        |            |
| CN | 109065632 A |   | 12/2018 |        |            |
| CN | 109786440 A |   | 5/2019  |        |            |
| JP | 2000012863 A |  | 1/2000  |        |            |

OTHER PUBLICATIONS

The Second Office Action in counterpart Chinese Application No. 201811598405.4, dated Jan. 6, 2021.
International Search Report in corresponding PCT Application No. PCT/CN2019/123618, dated Mar. 9, 2020 and Written Opinion of the International Searching Authority in corresponding PCT Application No. PCT/CN2019/123618, dated Mar. 9, 2020.

* cited by examiner

METHOD AND DEVICE FOR MANUFACTURING ARRAY SUBSTRATE, AND ARRAY SUBSTRATE

CROSS-REFERENCE TO RELATED APPLICATIONS

This application is a National Stage of International Application No. PCT/CN2019/123618, filed on Dec. 6, 2019, which claims priority to Chinese Application No. 201811598405.4, filed on Dec. 25, 2018, and entitled "METHOD AND DEVICE FOR MANUFACTURING ARRAY SUBSTRATE, AND ARRAY SUBSTRATE", the entire disclosure of which is incorporated herein by reference.

TECHNICAL FIELD

The present disclosure relates to the technical field of thin film transistors, in particular to a method and a device for manufacturing an array substrate, and an array substrate.

BACKGROUND

The statements here only provide background information related to the present disclosure, and do not necessarily constitute related art.

Liquid crystal displays have now become the mainstream in the market, and their working principle is that the liquid crystal will deflect under the drive of electric current, allowing light to pass through easily, thereby displaying images. However, the liquid crystal may be polarized after being driven for a long time, or because of the leakage of the thin film transistor array substrate, causing the liquid crystal molecule cannot be deflected normally under the control of the signal voltage. After a period of time, the traces of the still picture will still be seen, that is, the Image Sticking (IS) phenomenon, and one or part of the still picture will remain on the screen for a long time.

SUMMARY

The main objective of the present disclosure is to provide a method and a device for manufacturing an array substrate, and an array substrate, which aims to improve the stability of the thin film transistor array substrate.

In order to achieve the above objective, the present disclosure provides a method for manufacturing an array substrate, including the following operations:

depositing and forming a gate insulation layer on a pre-formed base substrate and a pre-formed gate, the gate insulation layer covering the pre-formed gate;

depositing and forming an amorphous silicon layer, a doped amorphous silicon layer and a metal layer on the gate insulation layer in sequence, the doped amorphous silicon layer being provided on the amorphous silicon layer and including at least three doped layers, doping concentrations of the at least three doped layers of the doped amorphous silicon layer increasing from bottom to top;

etching patterns of the amorphous silicon layer, the doped amorphous silicon layer and the metal layer; and forming a passivation layer covering the patterns of the amorphous silicon layer, the doped amorphous silicon layer and the metal layer on the gate insulation layer to form the array substrate.

In an embodiment, the gate insulation layer includes a first gate insulation layer and a second gate insulation layer, the operation of depositing and forming a gate insulation layer on a pre-formed base substrate and a pre-formed gate includes:

depositing and forming the first gate insulation layer covering the pre-formed gate on the pre-formed base substrate and the pre-formed gate; and depositing and forming the second gate insulation layer on the first gate insulation layer, a deposition rate of the first gate insulation layer being greater than a deposition rate of the second gate insulation layer.

In an embodiment, a thickness of the first gate insulation layer is greater than a thickness of the second gate insulation layer.

In an embodiment, after the operation of depositing and forming an amorphous silicon layer, a doped amorphous silicon layer including at least three doped layers, and a metal layer on the gate insulation layer in sequence, the method further includes:

etching the amorphous silicon layer with a remaining thickness of 450 Å to 550 Å in a channel region when the amorphous silicon layer is back-channel etched.

In an embodiment, the doped amorphous silicon layer includes a first doped layer, a second doped layer, a third doped layer, and a fourth doped layer with the doping concentrations increasing from bottom to top.

In an embodiment, a proportion of the doping concentrations of the first doped layer, the second doped layer, the third doped layer and the fourth doped layer is 1:1.5:2.5:3.

In an embodiment, a thickness of each layer of the at least three doped layers is equal.

In an embodiment, the operation of etching patterns of the amorphous silicon layer, the doped amorphous silicon layer and the metal layer includes:

forming a photolithography mask on the metal layer;

etching the metal layer, the doped amorphous silicon layer, and the amorphous silicon layer based on the photolithography mask;

removing the photolithography mask in a channel region to expose the metal layer in the channel region; and etching the metal layer, the doped amorphous silicon layer and the amorphous silicon layer in the channel region in sequence to form a channel zone of the array substrate.

In an embodiment, before the operation of forming a passivation layer covering the patterns of the amorphous silicon layer, the doped amorphous silicon layer and the metal layer on the gate insulation layer to form the array substrate, the method further includes:

heat-treating a patterned doped amorphous silicon layer based on nitride gas; and after the operation of forming a passivation layer covering the patterns of the amorphous silicon layer, the doped amorphous silicon layer and the metal layer on the gate insulation layer to form the array substrate, the method further includes:

driving the array substrate based on a voltage within a preset voltage range, and the preset voltage range is 14.6 V to 15.6 V.

In order to achieve the above objective, the present disclosure further provides a device for manufacturing an array substrate, including a memory, a processor, a program for manufacturing the array substrate stored in the memory and executable by the processor, the program, when executed by the processor, performs the operations of the method for manufacturing the array substrate as described above.

In order to achieve the above objective, the present disclosure further provides an array substrate. The array substrate includes a base substrate. A gate, a gate insulation layer, an amorphous silicon layer, a doped amorphous silicon layer, a metal layer, and a passivation layer are provided on the base substrate in sequence; and the doped amorphous silicon layer includes at least three doped layers, and doping concentrations of the at least three doped layers of the doped amorphous silicon layer increases from bottom to top.

In an embodiment, the doped amorphous silicon layer includes a first doped layer, a second doped layer, a third doped layer, and a fourth doped layer with the doping concentrations increasing from bottom to top.

In an embodiment, a proportion of the doping concentrations of the first doped layer, the second doped layer, the third doped layer and the fourth doped layer is 1:1.5:2.5:3.

In an embodiment, a thickness of each layer of the at least three doped layers is equal.

In an embodiment, the gate insulation layer includes a first gate insulation layer and a second gate insulation layer;

the first gate insulation layer is provided on the base substrate and covering the pre-formed gate;

the second gate insulation layer is provided on the first gate insulation layer; and a thickness of the first gate insulation layer is greater than a thickness of the second gate insulation layer.

The present disclosure provides a method and a device for manufacturing an array substrate, and an array substrate. The method includes: depositing and forming a gate insulation layer on a pre-formed base substrate and a pre-formed gate, the gate insulation layer covering the pre-formed gate; depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top; etching patterns of the amorphous silicon layer, the doped amorphous silicon layer and the metal layer; and forming a passivation layer covering the patterns of the amorphous silicon layer, the doped amorphous silicon layer and the metal layer on the gate insulation layer to form the array substrate. In this way, the problem that the thin film transistor is prone to image sticking is solved through improving the stability of the thin film transistor array substrate.

The realization of the objective, functional characteristics, and advantages of the present disclosure are further described with reference to the accompanying drawings.

DETAILED DESCRIPTION OF THE EMBODIMENTS

It should be understood that the specific embodiments described herein are only used to explain the present disclosure, and do not limit the present disclosure.

The solutions of one or several embodiments of the present disclosure are:

depositing and forming a gate insulation layer on a pre-formed base substrate and a pre-formed gate, the gate insulation layer covering the pre-formed gate;

depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top;

etching patterns of the amorphous silicon layer, the doped amorphous silicon layer and the metal layer; and forming a passivation layer covering the patterns of the amorphous silicon layer, the doped amorphous silicon layer and the metal layer on the gate insulation layer to form the array substrate.

In this way, in the present disclosure, by forming at least three doped amorphous silicon layers with the doping concentrations gradually increasing from bottom to top, the energy barrier of the doped amorphous silicon layer is increased, thereby reducing the leakage current, enhancing the stability of the array substrate, and solving the problem that the thin film transistor is prone to image sticking.

Figure 1:
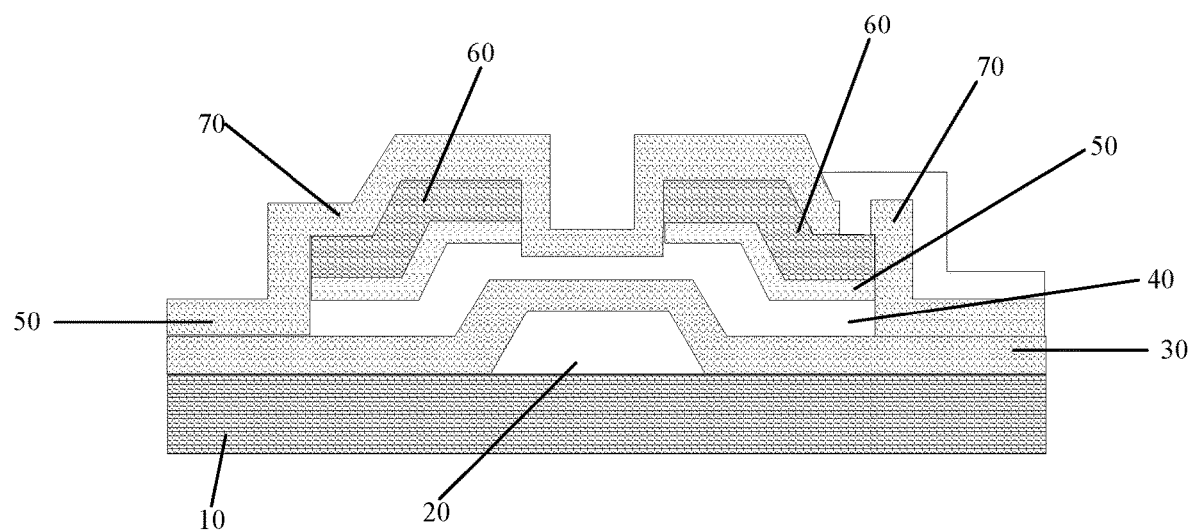
FIG. 1 is a schematic structural diagram of an array substrate according to an embodiment of the present disclosure.
Figure 2:
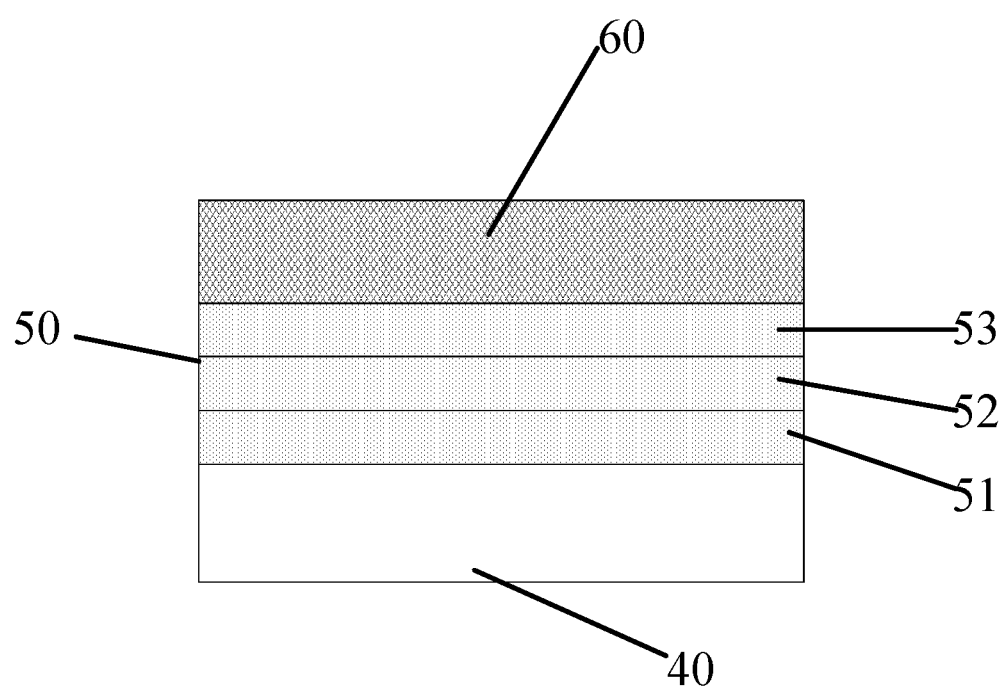
FIG. 2 is a schematic structural diagram of the array substrate according to another embodiment of the present disclosure.
Figure 3:
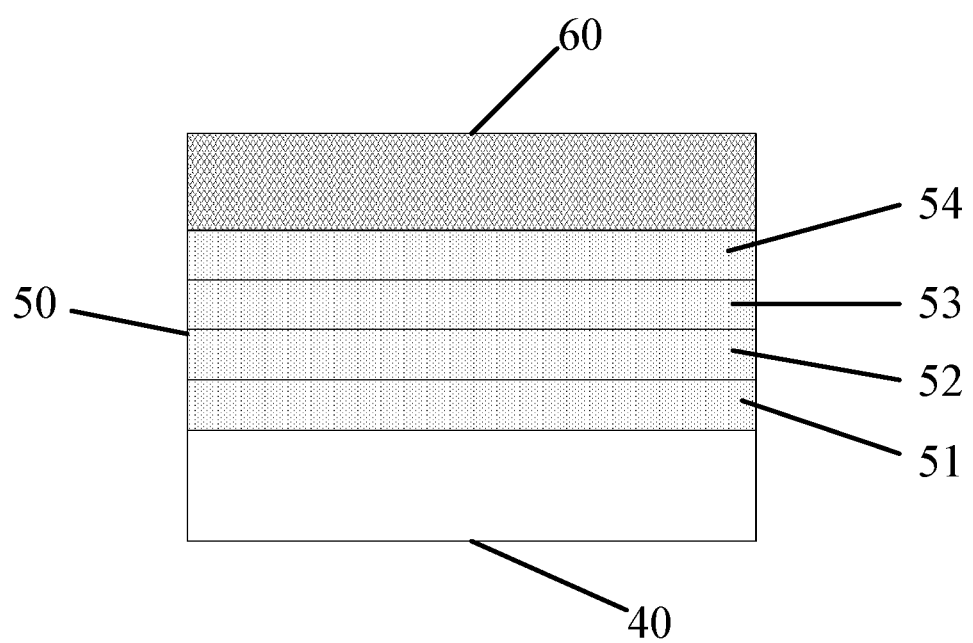
FIG. 3 is a schematic structural diagram of the array substrate according to yet another embodiment of the present disclosure.

As shown in FIGS. 1, 2 and 3, FIG. 1 is a schematic structural diagram of an array substrate according to an embodiment of the present disclosure, FIG. 2 is a schematic structural diagram of an interlayer of three doped amorphous silicon layers of the array substrate according to another embodiment of the present disclosure, and FIG. 3 is a schematic structural diagram of an interlayer of four doped amorphous silicon layers of the array substrate according to yet another embodiment of the present disclosure.

The present disclosure provides an array substrate. As shown in FIG. 1, the array substrate includes a base substrate 10, a gate 20 provided on the base substrate 10, a gate insulation layer 30 provided on the base substrate 10 and covering the pre-formed gate 20, an amorphous silicon layer 40 provided on the gate insulation layer 30, a doped amorphous silicon layer 50 provided on the amorphous silicon layer 40, a metal layer 60 provided on the doped amorphous silicon layer 50, and a passivation layer 70 provided on the gate insulation layer 30 and covering the amorphous silicon layer 40, the doped amorphous silicon layer 50, and the metal layer 60. The doped amorphous silicon layer 50 includes at least three doped layers, and doping concentrations of the at least three doped layers of the doped amorphous silicon layer increases gradually from bottom to top. It should be noted that the array substrate may also be a pixel electrode (not shown) that includes a passivation via hole passing through the passivation layer.

It should be noted that the metal layer includes a source electrode and a drain electrode (not shown). The metal layer may be made of one or more of manganese, molybdenum, titanium, aluminum and copper that are stacked. The amorphous silicon layer may be made of A-Si amorphous silicon. The gate insulation layer may be made of silicon oxide and/or silicon nitride. The gate may be made of one or more of molybdenum, titanium, aluminum and copper that are stacked. The base substrate may be a glass substrate.

In an embodiment, a thickness of each layer of the at least three doped layers is equal. It should be noted that the doped amorphous silicon layer may be an N-type (Negative) doped amorphous silicon layer or a P-type (Positive) doped amorphous silicon layer. In an embodiment, the doped amorphous silicon layer is an N-type doped amorphous silicon layer.

In an embodiment of the present disclosure, the doped amorphous silicon layer includes three doped layers with doping concentrations gradually increasing from bottom to top. As shown in FIG. 2, the doped amorphous silicon layer includes a first doped layer 51, a second doped layer 52, and a third doped layer 53 with doping concentrations gradually increasing from bottom to top. It should be noted that the first doped layer 51 is provided on the amorphous silicon layer 40, the second doped layer 52 is provided on the first doped layer 51, the third doped layer 53 is provided on the second doped layer 52, and the metal layer 60 is provided on the third doped layer 53.

When the N-type doped amorphous silicon layer has three doped layers, the proportion of each doped layer may also be that a concentration of doped P phosphorus atoms of the second doped layer is 2 to 6 times as that of the first doped layer; and a concentration of doped P phosphorus atoms of the third doped layer is 1.5 to 3 times as that of the second doped layer.

In an embodiment of the present disclosure, the doped amorphous silicon layer includes four doped layers with doping concentrations gradually increasing from bottom to top. As shown in FIG. 3, the doped amorphous silicon layer includes a first doped layer 51, a second doped layer 52, a third doped layer 53, and a fourth doped layer 54 with doping concentrations gradually increasing from bottom to top. It should be noted that the first doped layer 51 is provided on the amorphous silicon layer 40, the second doped layer 52 is provided on the first doped layer 51, the third doped layer 53 is provided on the second doped layer 52, the fourth doped layer 54 is provided on the third doped layer 53, and the metal layer 60 is provided on the third doped layer 54.

In an embodiment, when the N-type doped amorphous silicon layer has four doped layers, the proportion of each doped layer may also be that a concentration of doped P phosphorus atoms of the second doped layer is 1.5 to 3 times as that of the first doped layer; a concentration of doped P phosphorus atoms of the third doped layer is 2 to 6 times as that of the second doped layer; and a concentration of doped P phosphorus atoms of the fourth doped layer is 1.5 to 3 times as that of the third doped layer.

In an embodiment, when the N-type doped amorphous silicon layer has four doped layers, the proportion of the doping concentrations of the first doped layer, the second doped layer, the third doped layer and the fourth doped layer is 1:1.5:2.5:3.

The present disclosure provides an array substrate.

At least three doped layers with doping concentrations increasing from bottom to top are provided between the amorphous silicon layer and the metal layer, which increases the energy barrier, such that the electron injection is easier, thereby reducing the leakage current, improving the stability of the thin film transistor, and solving the problem that the thin film transistor is prone to image sticking.

In an embodiment, when manufacturing the array substrate, the gate insulation layer is formed by chemical vapor deposition on the pre-formed base substrate and gate. The gate insulation layer covers the gate. An amorphous silicon layer, a doped amorphous silicon layer including at least three doped layers, and a metal layer are sequentially deposited on the gate insulation layer. The doped ion concentration of each layer of the doped amorphous silicon layer increases from bottom to top. The doped amorphous silicon layer with four doped layers is taken as an example. The doping concentration of the first doping layer is less than the doping concentration of the second doping layer. The doping concentration of the second doping layer is less than the doping concentration of the third doping layer, and the doping concentration of the third doping layer is less than the doping concentration of the fourth doping layer.

Specially, when forming an N-type doped amorphous silicon layer with three doped layers based on the deposition of phosphine ($PH_3$) and tetrahydrosilicon (monosilane, $SiH_4$), a airflow ratio of $PH_3$ and $SiH_4$ of the first doped layer may be 0.8, an airflow ratio of $PH_3$ and $SiH_4$ of the second doped layer may be 1.8, and an airflow ratio of $PH_3$ and $SiH_4$ of the third doped layer may be 4.5. It should be noted that since phosphorus atoms are five-valent atoms, silicon atoms are four-valent atoms, during the combination reaction, when the phosphorus atom replaces the silicon atom, the phosphorus atom will have one more electron to form an N-type structure.

Specially, when forming an N-type doped amorphous silicon layer with four doped layers based on the deposition of $PH_3$ and $SiH_4$, an airflow ratio of $PH_3$ and $SiH_4$ of the first doped layer may be 0.5, an airflow ratio of $PH_3$ and $SiH_4$ of the second doped layer may be 1.5, an airflow ratio of $PH_3$ and $SiH_4$ of the third doped layer may be 3, and an airflow ratio of $PH_3$ and $SiH_4$ of the fourth doped layer may be 4.5.

In an embodiment, after depositing and forming a metal layer on the doped amorphous silicon layer, the amorphous silicon layer, the doped amorphous silicon layer and the metal layer may be patterned by the 4Mask process (four-step photolithography process), to etch the patterns of the amorphous silicon layer, the doped amorphous silicon layer and the metal layer. Specially, photoresist is applied on the metal layer, and is exposed and developed through a two-tone mask, and the photoresist is removed in the exposed area, then, the metal layer, the doped amorphous silicon layer and the amorphous silicon layer in the exposed area are etched. The plasma ashing process is used to remove the photoresist in the semi-exposed area to expose the metal layer in the channel region corresponding to the semi-exposed area, and then the metal layer in the channel region is etched to form the source electrode and drain electrode of the metal layer, and the doped amorphous silicon layer and the amorphous silicon layer in the channel region is etched. The amorphous silicon layer is etched so that a remaining thickness of the amorphous silicon layer in the channel region is 450 Å to 550 Å. In an embodiment, the remaining thickness may be 500 Å. It should be noted that by forming an amorphous silicon layer with a remaining thickness of 450 Å to 550 Å in the channel region, leakage current can be reduced to lighten the problem of the thin film transistor being prone to image sticking.

Specially, after patterning the metal layer, the doped amorphous silicon layer and the amorphous silicon layer, a passivation layer covering the patterns of the amorphous silicon layer, the doped amorphous silicon layer and the metal layer is formed on the gate insulation layer. Besides, a pixel layer passing through the passivation via hole of the passivation layer is formed to form an array substrate.

In this way, in the present disclosure, by forming at least three doped amorphous silicon layers with the doping concentrations gradually increasing from bottom to top, the energy barrier of the doped amorphous silicon layer is increased, thereby reducing the leakage current, enhancing the stability of the array substrate, and solving the problem that the thin film transistor is prone to image sticking.

Figure 4:
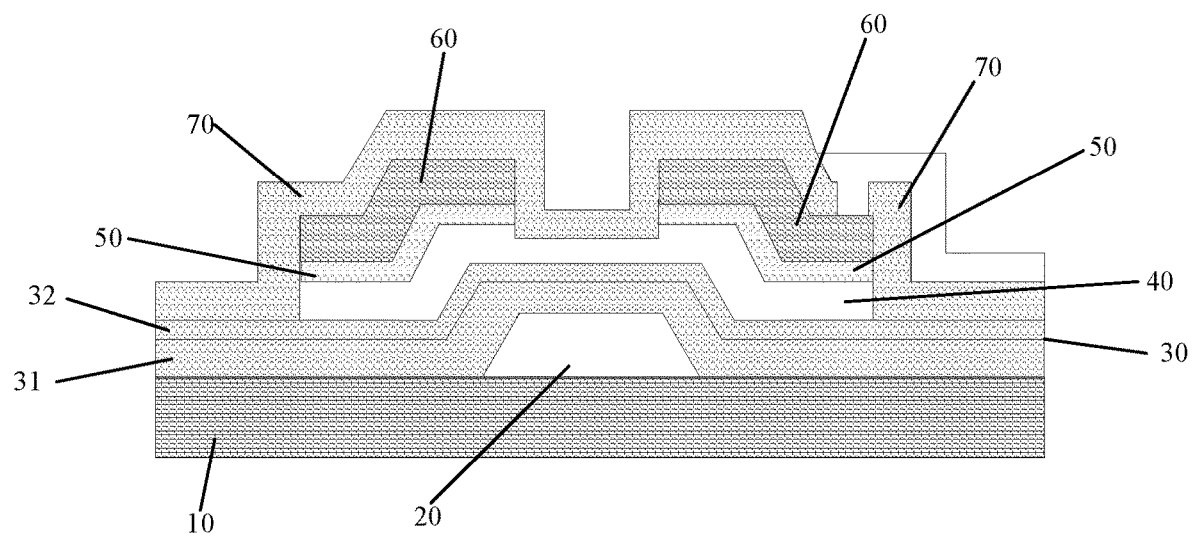
FIG. 4 is a schematic structural diagram of the array substrate according to still another embodiment of the present disclosure.

As shown in FIG. 4, FIG. 4 is a schematic structural diagram of the array substrate according to still another embodiment of the present disclosure. On the basis of the above-mentioned embodiments in FIGS. 1 to 3, the gate insulation layer 30 of the array substrate provided by the present disclosure includes a first gate insulation layer 31 and a second gate insulation layer 32. The first gate insulation layer 31 is provided on the base substrate 10 and covers the gate 20. The second gate insulation layer 32 is provided on the first gate insulation layer 31.

A thickness of the first gate insulation layer is greater than a thickness of the second gate insulation layer. In an embodiment, the thickness of the first gate insulation layer is 2500 Å (Angstrom), and the thickness of the second gate insulation layer is 1000 Å (Angstrom).

Specially, during the process of manufacturing the array substrate, when the gate insulation layer is deposited and formed, the first gate insulation layer covering the pre-formed gate is deposited on the pre-formed base substrate and the pre-formed gate. The second gate insulation layer is deposited and formed on the first gate insulation layer, the deposition rate of the first gate insulation layer is greater than the deposition rate of the second gate insulation layer. Specifically, the first gate insulation layer is prepared in accordance with the conventional deposition rate process parameters, and the second gate insulation layer is prepared with process parameters lower than the conventional deposition rate. In this way, a gate insulation layer is formed through forming the first gate insulation layer with a thickness of 2500 Å and the second gate insulation layer with a thickness of 1000 Å to reduce weak Si—H bonds, thereby improving the stability of the array substrate, and effectively improving the problem that the thin film transistor is prone to image sticking.

The present disclosure provides a method for manufacturing an array substrate, which solves the problem that the thin film transistor is prone to image sticking by improving the stability of the array substrate.

Figure 5:
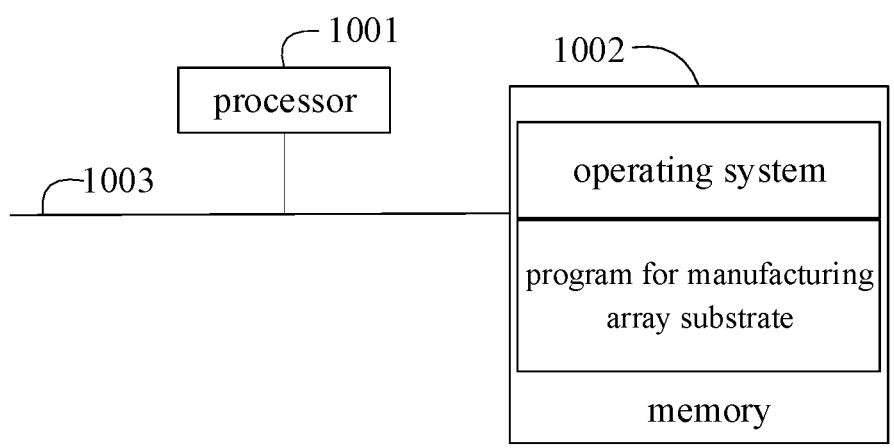
FIG. 5 is a schematic diagram of the hardware operating environment of a terminal according to an embodiment of the present disclosure.

As shown in FIG. 5, FIG. 5 is a schematic diagram of the hardware operating environment of a terminal according to an embodiment of the present disclosure.

The terminal of the embodiment of the present disclosure may be a device for manufacturing an array substrate.

As shown in FIG. 5, the terminal may include a processor 1001, such as a Central Processing Unit (CPU), a memory 1002, and a communication bus 1003. The communication bus 1003 realizes connection and communication between various components in the terminal. The memory 1002 may be a high-speed random-access memory (RAM), or a stable memory (non-volatile memory), such as a magnetic disk memory. In an embodiment, the memory 1002 may also be a storage device independent of the foregoing processor 1001.

Those skilled in the art can understand the structure of the terminal shown in FIG. 5 does not constitute a limitation on the terminal of the embodiment of the present disclosure, and may include more or fewer components than shown in the figure, or a combination of certain components, or components with different arrangements.

As shown in FIG. 5, the memory 1002 as a computer storage medium, may include a program for manufacturing the array substrate.

In the terminal shown in FIG. 5, the processor 1001 may call the program for manufacturing the array substrate stored in the memory 1002, and perform the following operations:

depositing and forming a gate insulation layer on a pre-formed base substrate and a pre-formed gate, the gate insulation layer covering the pre-formed gate;

depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top;

etching patterns of the amorphous silicon layer, the doped amorphous silicon layer and the metal layer; and forming a passivation layer covering the patterns of the amorphous silicon layer, the doped amorphous silicon layer and the metal layer on the gate insulation layer to form the array substrate.

Further, the processor 1001 may call the program for manufacturing the array substrate stored in the memory 1002, and further perform the following operations:

depositing and forming the first gate insulation layer covering the pre-formed gate on the pre-formed base substrate and the pre-formed gate; and depositing and forming the second gate insulation layer on the first gate insulation layer, a deposition rate of the first gate insulation layer being greater than a deposition rate of the second gate insulation layer.

Further, the processor 1001 may call the program for manufacturing the array substrate stored in the memory 1002, and further perform the following operations:

etching the amorphous silicon layer with a remaining thickness of 450 Å to 550 Å in a channel region when the amorphous silicon layer is back-channel etched.

Further, the processor 1001 may call the program for manufacturing the array substrate stored in the memory 1002, and further perform the following operations:

heat-treating a patterned doped amorphous silicon layer based on nitride gas.

Further, the processor 1001 may call the program for manufacturing the array substrate stored in the memory 1002, and further perform the following operations:

driving the array substrate based on a voltage within a preset voltage range, and the preset voltage range is 14.6 V to 15.6 V.

Figure 6:
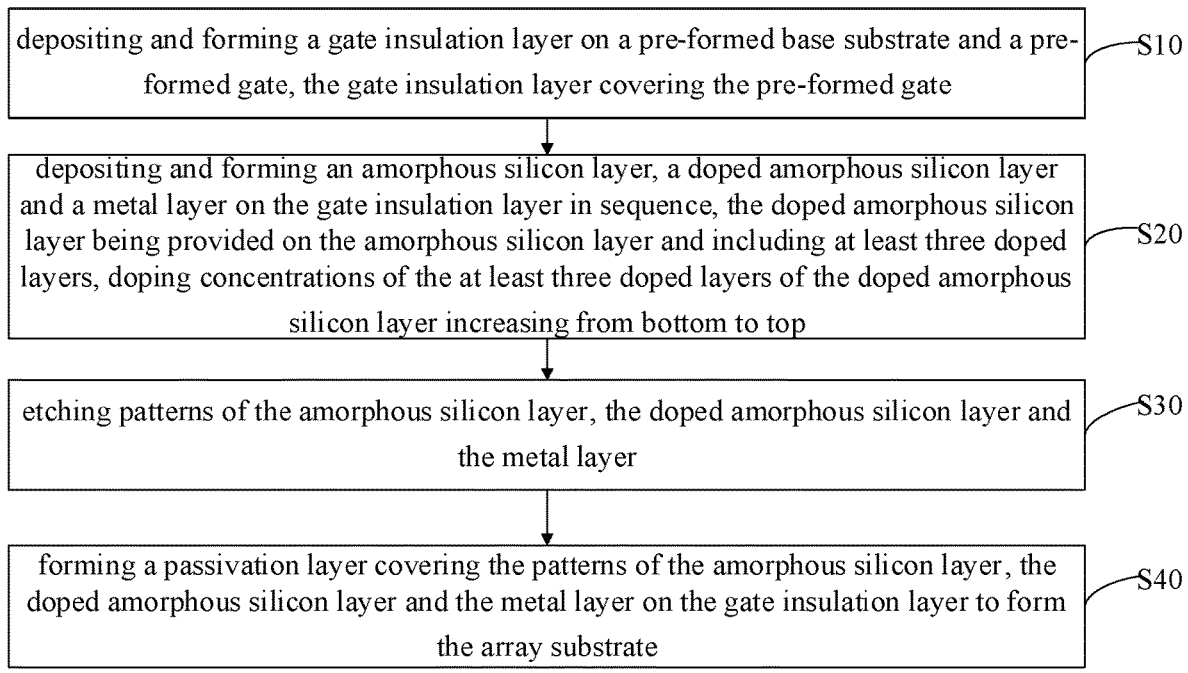
FIG. 6 is a schematic flowchart of a method for manufacturing an array substrate according to an embodiment of the present disclosure.

As shown in FIG. 6, in an embodiment, the method for manufacturing the array substrate includes:

Operation S10, depositing and forming a gate insulation layer on a pre-formed base substrate and a pre-formed gate, the gate insulation layer covering the pre-formed gate;

Operation S20, depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top;

Operation S30, etching patterns of the amorphous silicon layer, the doped amorphous silicon layer and the metal layer; and Operation S40, forming a passivation layer covering the patterns of the amorphous silicon layer, the doped amorphous silicon layer and the metal layer on the gate insulation layer to form the array substrate.

In this embodiment, the gate insulation layer is formed by chemical vapor deposition on the pre-formed base substrate and the pre-formed gate. The gate insulation layer covers the gate. An amorphous silicon layer, a doped amorphous silicon layer including at least three doped layers, and a metal layer are sequentially deposited on the gate insulation layer. The doped ion concentration of each layer of the doped amorphous silicon layer increases from bottom to top. Take the doped amorphous silicon layer with four doped layers as an example. The doping concentration of the first doping layer is less than the doping concentration of the second doping layer. The doping concentration of the second doping layer is less than the doping concentration of the third doping layer, and the doping concentration of the third doping layer is less than the doping concentration of the fourth doping layer.

Specially, when forming an N-type doped amorphous silicon layer with three doped layers based on the deposition of phosphine ($PH_3$) and tetrahydrosilicon (monosilane, $SiH_4$), an airflow ratio of $PH_3$ and $SiH_4$ of the first doped layer may be 0.8, an airflow ratio of $PH_3$ and $SiH_4$ of the second doped layer may be 1.8, and an airflow ratio of $PH_3$ and $SiH_4$ of the third doped layer may be 4.5.

Specially, when forming an N-type doped amorphous silicon layer with four doped layers based on the deposition of $PH_3$ and $SiH_4$, an airflow ratio of $PH_3$ and $SiH_4$ of the first doped layer may be 0.5, an airflow ratio of $PH_3$ and $SiH_4$ of the second doped layer may be 1.5, an airflow ratio of $PH_3$ and $SiH_4$ of the third doped layer may be 3, and an airflow ratio of $PH_3$ and $SiH_4$ of the fourth doped layer may be 4.5.

In an embodiment, after depositing and forming a metal layer on the doped amorphous silicon layer, the amorphous silicon layer, the doped amorphous silicon layer and the metal layer may be patterned by the 4Mask process (four-step photolithography process), to etch the patterns of the amorphous silicon layer, the doped amorphous silicon layer and the metal layer. Specially, the photoresist is applied on the metal layer, and is exposed and developed through a two-tone mask, and the photoresist is removed in the exposed area, then, the metal layer, the doped amorphous silicon layer and the amorphous silicon layer in the exposed area are etched. The plasma ashing process is used to remove the photoresist in the semi-exposed area to expose the metal layer in the channel region corresponding to the semi-exposed area, and then the metal layer in the channel region is etched to form the source electrode and drain electrode of the metal layer, and the doped amorphous silicon layer and the amorphous silicon layer in the channel region is etched. The amorphous silicon layer is etched so that the remaining thickness of the amorphous silicon layer in the channel region is 450 Å to 550 Å. In an embodiment, the remaining thickness may be 500 Å. It should be noted that by forming an amorphous silicon layer with a remaining thickness of 450 Å to 550 Å in the channel region, leakage current can be reduced to improve the problem of the thin film transistor being prone to image sticking.

In an embodiment, after patterning the metal layer, the doped amorphous silicon layer, and the amorphous silicon layer, the patterned doped amorphous silicon layer is heat-treated based on $NH_3$ ammonia gas. Specially, the substrate structure of the thin film transistor is processed for 50 seconds and the ambient temperature is 270° C. (degrees Celsius) to 300° C. (degrees Celsius) to remove the moisture on the surface of the thin film transistor substrate structure. Then, the N-type doped amorphous silicon layer is treated with $NH_3$ for 1 to 15 seconds based on the processing environment temperature of 270° C. to 300° C. The treatment time may be 7 seconds or 10 seconds. In this way, while the weak Si—H bond is reduced, the thin film transistor prepared based on the thin film transistor substrate has illumination and high brightness stability, which can effectively improve the problem of the thin film transistor being prone to image sticking.

In an embodiment, after patterning the metal layer, the doped amorphous silicon layer, and the amorphous silicon layer, the patterned doped amorphous silicon layer is heat-treated based on $N_2$ nitrogen gas and $NH_3$ ammonia gas. Specially, the substrate structure of the thin film transistor is processed for 50 seconds and the ambient temperature is 270° C. to 300° C. to remove the moisture on the surface of the thin film transistor substrate structure. Then, the N-type doped amorphous silicon layer is treated with $N_2$ for 1 to 20 seconds and $NH_3$ for 1 to 15 seconds based on the processing environment temperature of 270° C. to 300° C. The $N_2$ gas treatment time may be 10 seconds, and the $NH_3$ gas treatment time may be 7 seconds or 10 seconds. In this way, while the weak Si—H bond is reduced, the thin film transistor prepared based on the thin film transistor substrate has illumination and high brightness stability, which can effectively improve the problem of the thin film transistor being prone to image sticking.

After patterning the metal layer, the doped amorphous silicon layer and the amorphous silicon layer, and heat-treating the doped amorphous silicon layer based on $NH_3$ gas, a passivation layer covering the patterns of the amorphous silicon layer, the doped amorphous silicon layer and the metal layer is formed on the gate insulation layer, and a pixel layer passing through the passivation via hole of the passivation layer is formed to form a thin film transistor array substrate.

In an embodiment, the thin film transistor array substrate is a back-etched channel type array substrate.

In an embodiment, a display panel is manufactured based on the thin film transistor array substrate.

The array substrate is driven based on a voltage within a preset voltage range, and the preset voltage range is 14.6V (Volt) to 15.6V (Volt). In this way, by setting the Gamma voltage to 14.6V to 15.6V, the driving capability of the thin film transistor is increased, so that the thin film transistor is not prone to image sticking.

In an embodiment or several embodiments of the present disclosure, depositing and forming a gate insulation layer on a pre-formed base substrate and a pre-formed gate, the gate insulation layer covering the pre-formed gate; depositing and forming an amorphous silicon layer, a doped amorphous silicon layer including at least three doped layers, and a metal layer on the gate insulation layer in sequence, doping concentrations of the at least three doped layers of the doped amorphous silicon layer increasing from bottom to top; etching patterns of the amorphous silicon layer, the doped amorphous silicon layer and the metal layer; and forming a passivation layer covering the patterns of the amorphous silicon layer, the doped amorphous silicon layer and the metal layer on the gate insulation layer to form the array substrate. In this way, the problem that the thin film transistor is prone to image sticking is solved through improving the stability of the thin film transistor array substrate.

Figure 7:
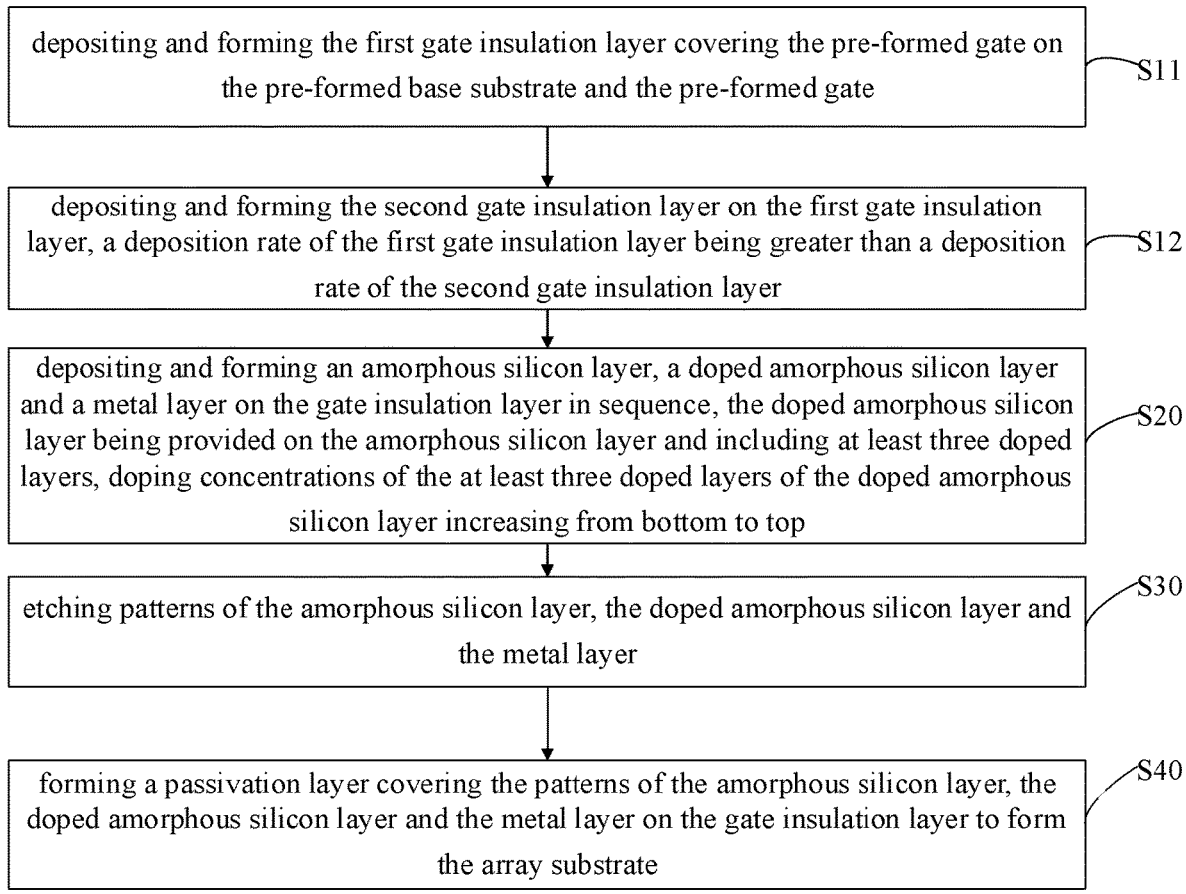
FIG. 7 is a schematic flowchart of the method for manufacturing an array substrate according to another embodiment of the present disclosure.

In another embodiment, as shown in FIG. 7, based on the embodiment shown in FIG. 6, the gate insulation layer includes a first gate insulation layer and a second gate insulation layer, the operation of depositing and forming a gate insulation layer on a pre-formed base substrate and a pre-formed gate includes:

Operation S11, depositing and forming the first gate insulation layer covering the pre-formed gate on the pre-formed base substrate and the pre-formed gate; and Operation S12, depositing and forming the second gate insulation layer on the first gate insulation layer, a deposition rate of the first gate insulation layer being greater than a deposition rate of the second gate insulation layer.

In this embodiment, the gate insulation layer of the array substrate includes a first gate insulation layer and a second gate insulation layer, and a thickness of the first gate insulation layer is greater than a thickness of the second gate insulation layer. In an embodiment, the thickness of the first gate insulation layer is 2500 Å, and the thickness of the second gate insulation layer is 1000 Å.

Specially, during the process of manufacturing the array substrate, when the gate insulation layer is deposited and formed, the first gate insulation layer covering the pre-formed gate is deposited on the pre-formed base substrate and the pre-formed gate. The second gate insulation layer is deposited and formed on the first gate insulation layer, the deposition rate of the first gate insulation layer is greater than the deposition rate of the second gate insulation layer. Specifically, the first gate insulation layer is prepared in accordance with the conventional deposition rate process parameters, and the second gate insulation layer is prepared with process parameters lower than the conventional deposition rate. In this way, a gate insulation layer is formed through forming the first gate insulation layer with a thickness of 2500 Å and the second gate insulation layer with a thickness of 1000 Å to reduce weak Si—H bonds, thereby improving the stability of the thin film transistor array substrate, and effectively improving the problem that the thin film transistor is prone to image sticking.

Besides, the present disclosure further provides a device for manufacturing an array substrate. The device includes a memory, a processor, a program for manufacturing the array substrate stored in the memory and executable on the processor, the program, when executed by the processor, implements the operations of the method for manufacturing the array substrate as described in the above embodiments.

The serial numbers of the foregoing embodiments of the present disclosure are only for description, and do not represent the advantages and disadvantages of the embodiments.

Through the description of the above embodiment, those skilled in the art can clearly understand that the above-mentioned embodiments can be implemented by software plus a necessary general hardware platform, of course, it can also be implemented by hardware, but in many cases the former is a better implementation. Based on this understanding, the technical solution of the present disclosure can be embodied in the form of software product in essence or the part that contributes to the existing technology. The computer software product is stored in a storage medium (such as ROM/RAM, magnetic disk, optical disk) as described above, including several instructions to cause a terminal device (which can be a mobile phone, a computer, a server, an air conditioner, or a network device, etc.) to execute the method described in each embodiment of the present disclosure.

The above are only optional embodiments of the present disclosure, and do not limit the scope of the present disclosure. Under the inventive concept of the present disclosure, any equivalent structural transformations made using the contents of the description and drawings of the present disclosure, or direct/indirect application in other related technical fields are included in the scope of the present disclosure.

What is claimed is:

1. A method for manufacturing an array substrate, comprising the following operations:
   depositing and forming a gate insulation layer on a pre-formed base substrate and a pre-formed gate, the gate insulation layer covering the pre-formed gate;
   depositing and forming an amorphous silicon layer, a doped amorphous silicon layer and a metal layer on the gate insulation layer in sequence, the doped amorphous silicon layer being provided on the amorphous silicon layer and comprising at least three doped layers, doping concentrations of the at least three doped layers of the doped amorphous silicon layer increasing from bottom to top;
   etching patterns of the amorphous silicon layer, the doped amorphous silicon layer and the metal layer; and
   forming a passivation layer covering the patterns of the amorphous silicon layer, the doped amorphous silicon layer and the metal layer on the gate insulation layer to form the array substrate;
   wherein the gate insulation layer comprises a first gate insulation layer and a second gate insulation layer, the operation of depositing and forming a gate insulation layer on a pre-formed base substrate and a pre-formed gate comprises:
   depositing and forming the first gate insulation layer covering the pre-formed gate on the pre-formed base substrate and the pre-formed gate; and
   depositing and forming the second gate insulation layer on the first gate insulation layer, a deposition rate of the first gate insulation layer being greater than a deposition rate of the second gate insulation layer:
   a thickness of the first gate insulation layer is 2500 Å and a thickness of the second gate insulation layer is 1000 Å;
   when forming an N-type doped amorphous silicon layer with three doped layers, comprising a first doped layer, a second doped layer and a third doped layer, based on a deposition of phosphine ($PH_3$) and tetrahydrosilicon (monosilane, $SiH_4$), an airflow ratio of $PH_3$ and $SiH_4$ of the first doped layer is 0.8, an airflow ratio of $PH_3$ and $SiH_4$ of the second doped layer is 1.8, and an airflow ratio of $PH_3$ and $SiH_4$ of the third doped layer is 4.5; and
   when forming an N-type doped amorphous silicon layer with four doped layers, comprising a first doped layer, a second doped layer, a third doped layer and a fourth doped layer, based on a deposition of $PH_3$ and $SiH_4$, an airflow ratio of $PH_3$ and $SiH_4$ of the first doped layer is 0.5, an airflow ratio of $PH_3$ and $SiH_4$ of the second doped layer is 1.5, an airflow ratio of $PH_3$ and $SiH_4$ of the third doped layer is 3, and an airflow ratio of $PH_3$ and $SiH_4$ of the fourth doped layer is 4.5.

2. The method of claim 1, wherein after the operation of depositing and forming an amorphous silicon layer, a doped amorphous silicon layer and a metal layer on the gate insulation layer in sequence, the method further comprises:
   etching the amorphous silicon layer with a remaining thickness of 450 Å to 550 Å in a channel region when the amorphous silicon layer is back-channel etched.

3. The method of claim 1, wherein a proportion of the doping concentrations of the first doped layer, the second doped layer, the third doped layer and the fourth doped layer is 1:1.5:2.5:3.

4. The method of claim 1, wherein a thickness of each layer of the at least three doped layers is equal.

5. The method of claim 1, wherein the operation of etching patterns of the amorphous silicon layer, the doped amorphous silicon layer and the metal layer comprises:
  forming a photolithography mask on the metal layer;
  etching the metal layer, the doped amorphous silicon layer, and the amorphous silicon layer based on the photolithography mask;
  removing the photolithography mask in a channel region to expose the metal layer in the channel region; and
  etching the metal layer, the doped amorphous silicon layer and the amorphous silicon layer in the channel region in sequence to form a channel zone of the array substrate.

6. The method of claim 1, wherein before the operation of forming a passivation layer covering the patterns of the amorphous silicon layer, the doped amorphous silicon layer and the metal layer on the gate insulation layer to form the array substrate, the method further comprises:
  heat-treating a patterned doped amorphous silicon layer based on nitride gas.

7. The method of claim 1, wherein after the operation of forming a passivation layer covering the patterns of the amorphous silicon layer, the doped amorphous silicon layer and the metal layer on the gate insulation layer to form the array substrate, the method further comprises:
  driving the array substrate based on a voltage within a preset voltage range, and the preset voltage range is 14.6 V to 15.6 V.

8. A device for manufacturing an array substrate, wherein the device comprises a memory, a processor, a program stored in the memory and executed by the processor, the program, when executed by the processor, performs the following operations:
  depositing and forming a gate insulation layer on a pre-formed base substrate and a pre-formed gate, the gate insulation layer covering the pre-formed gate;
  depositing and forming an amorphous silicon layer, a doped amorphous silicon layer and a metal layer on the gate insulation layer in sequence, the doped amorphous silicon layer being provided on the amorphous silicon layer and comprising at least three doped layers, doping concentrations of the at least three doped layers of the doped amorphous silicon layer increasing from bottom to top;
  etching patterns of the amorphous silicon layer, the doped amorphous silicon layer and the metal layer; and
  forming a passivation layer covering the patterns of the amorphous silicon layer, the doped amorphous silicon layer and the metal layer on the gate insulation layer to form the array substrate;
  wherein the gate insulation layer comprises a first gate insulation layer and a second gate insulation layer, the operation of depositing and forming a gate insulation layer on a pre-formed base substrate and a pre-formed gate comprises:
  depositing and forming the first gate insulation layer covering the pre-formed gate on the pre-formed base substrate and the pre-formed gate; and
  depositing and forming the second gate insulation layer on the first gate insulation layer, a deposition rate of the first gate insulation layer being greater than a deposition rate of the second gate insulation layer;
  a thickness of the first gate insulation layer is 2500 Å and a thickness of the second gate insulation layer is 1000 Å;
  when forming an N-type doped amorphous silicon layer with three doped layers, comprising a first doped layer, a second doped layer and a third doped layer, based on a deposition of phosphine ($PH_3$) and tetrahydrosilicon (monosilane, $SiH_4$), an airflow ratio of $PH_3$ and $SiH_4$ of the first doped layer is 0.8, an airflow ratio of $PH_3$ and $SiH_4$ of the second doped layer is 1.8, and an airflow ratio of $PH_3$ and $SiH_4$ of the third doped layer is 4.5; and
  when forming an N-type doped amorphous silicon layer with four doped layers, comprising a first doped layer, a second doped layer, a third doped layer and a fourth doped layer, based on a deposition of $PH_3$ and $SiH_4$, an airflow ratio of $PH_3$ and $SiH_4$ of the first doped layer is 0.5, an airflow ratio of $PH_3$ and $SiH_4$ of the second doped layer is 1.5, an airflow ratio of $PH_3$ and $SiH_4$ of the third doped layer is 3, and an airflow ratio of $PH_3$ and $SiH_4$ of the fourth doped layer is 4.5.

9. The device of claim 8, wherein a proportion of the doping concentrations of the first doped layer, the second doped layer, the third doped layer and the fourth doped layer is 1:1.5:2.5:3.

10. An array substrate, wherein the array substrate comprises a base substrate,
  a gate, a first gate insulation layer, a second gate insulation layer, an amorphous silicon layer, a doped amorphous silicon layer, a metal layer, and a passivation layer are provided on the base substrate in sequence; and
  the doped amorphous silicon layer comprises at least three doped layers, and doping concentrations of the at least three doped layers of the doped amorphous silicon layer increases from bottom to top;
  a deposition rate of the first gate insulation layer is greater than a deposition rate of the second gate insulation layer;
  a thickness of the first gate insulation layer is 2500 Å and a thickness of the second gate insulation layer is 1000 Å;
  wherein when forming an N-type doped amorphous silicon layer with three doped layers, comprising a first doped layer, a second doped layer and a third doped layer, based on a deposition of phosphine ($PH_3$) and tetrahydrosilicon (monosilane, $SiH_4$), an airflow ratio of $PH_3$ and $SiH_4$ of the first doped layer is 0.8, an airflow ratio of $PH_3$ and $SiH_4$ of the second doped layer is 1.8, and an airflow ratio of $PH_3$ and $SiH_4$ of the third doped layer is 4.5; and
  when forming an N-type doped amorphous silicon layer with four doped layers, comprising a first doped layer, a second doped layer, a third doped layer and a fourth doped layer, based on a deposition of $PH_3$ and $SiH_4$, an airflow ratio of $PH_3$ and $SiH_4$ of the first doped layer is 0.5, an airflow ratio of $PH_3$ and $SiH_4$ of the second doped layer is 1.5, an airflow ratio of $PH_3$ and $SiH_4$ of the third doped layer is 3, and an airflow ratio of $PH_3$ and $SiH_4$ of the fourth doped layer is 4.5.

11. The array substrate of claim 10, wherein a proportion of the doping concentrations of the first doped layer, the second doped layer, the third doped layer and the fourth doped layer is 1:1.5:2.5:3.

12. The array substrate of claim 10, wherein a thickness of each layer of the at least three doped layers is equal.

\* \* \* \* \*